United States Patent
Park et al.

(10) Patent No.: US 7,157,359 B2
(45) Date of Patent: Jan. 2, 2007

(54) METHOD OF FORMING A METAL GATE IN A SEMICONDUCTOR DEVICE USING ATOMIC LAYER DEPOSITION PROCESS

(75) Inventors: Dae Gyu Park, Kyungki-Do (KR); Heung Jae Cho, Kyungki-Do (KR); Kwan Yong Lim, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/036,156

(22) Filed: Dec. 26, 2001

(65) Prior Publication Data

US 2002/0086507 A1  Jul. 4, 2002

(30) Foreign Application Priority Data

Dec. 29, 2000  (KR) ............... 2000-85582

(51) Int. Cl.
*H01L 21/3205* (2006.01)
(52) U.S. Cl. ...................... 438/585; 438/653
(58) Field of Classification Search ........ 438/197, 438/299, 585, 587, 588, 592, 652, 653, 654, 438/656, 657, 680, 684
See application file for complete search history.

(56) References Cited

FOREIGN PATENT DOCUMENTS

| JP | 6-5852 | 1/1994 |
|---|---|---|
| JP | 9-143699 | 6/1997 |
| JP | 11-172438 | 6/1999 |
| JP | 2000-54134 | 2/2000 |
| JP | 2000-91269 | 3/2000 |
| JP | 2000-124154 | 4/2000 |

OTHER PUBLICATIONS

Official Action issued from Japanese Patent Office dated May 25, 2005.
Park, Dae-Gyu, et al., "Properties of reactive-sputtered $Ti_{1-x}Al_xN$ thin films", Meeting Abstracts of The 195$^{th}$ Meeting of The Electrochemical Society, Inc. in Seattle, Washington on May 2-6, 1999, Abstract No. 476.
Moriwaki, M., et al., "Impacts of Chlorine in CVD-TiN Gate Electrode on the Gate Oxide Reliability in Multiple-Thickness Oxide Technology", Extended Abstracts of the 2000 International Conference on Solid State Devices and Materials, Sendai, 2000, pp. 188-189.
Hu, J.C., et al., "Feasibility of Using W/TiN as Metal Gate for Conventional 0.13 μm CMOS Technology and Beyond", International Electron Devices Meeting (IEDM 97) pp. 825-828, © 1997 IEEE.

(Continued)

*Primary Examiner*—Jack Chen
(74) *Attorney, Agent, or Firm*—Marshall, Gerstein & Borun LLP

(57) ABSTRACT

A method for forming a metal gate capable of preventing degradation in a characteristic of a gate insulating film upon formation of the metal gate. The method of forming the metal gate comprises the steps of providing a silicon substrate having device isolation films of a trench shape for defining an active region; forming a gate insulating film on the surface of the silicon substrate by means of a thermal oxidation process; sequentially forming a barrier metal film and a metal film for the gate on the gate insulating film; and patterning the metal film for the gate, the barrier metal film and the gate insulating film, wherein deposition of the barrier metal film and the metal film for the gate is performed by means of an atomic layer deposition (ALD) process or remote plasma chemical vapor deposition (CVD) process.

7 Claims, 4 Drawing Sheets

OTHER PUBLICATIONS

Nakajima, K., et al., "Work Function Controller Metal Gate Electrode on Ultrathin Gate Insulators", 1999 Symposium on VLSI Technology Digest of Technical Papers, pp. 95-96.

Amazawa, T., et al., "Surface State Generation of Mo Gate Metal Oxide Semiconductor Devices Caused by Mo Penetration into Gate Oxide", J. Electrochem. Soc., vol. 145, No. 4, Apr. 1998 © The Electrochemical Society, Inc.

METHOD OF FORMING A METAL GATE IN A SEMICONDUCTOR DEVICE USING ATOMIC LAYER DEPOSITION PROCESS

FIELD OF THE DISCLOSED METHOD

The disclosed method relates generally to a method of forming a metal gate in semiconductor devices. More particularly, the disclosed method relates to a method of forming a metal gate in a semiconductor device capable of preventing degradation of a gate oxide integrity (GOI) characteristic in a gate insulating film.

BACKGROUND OF THE DISCLOSED METHOD AND PRIOR ART

As well known in the art, a silicon oxide film ($SiO_2$) has been mainly used as a material of a gate insulating film in MOSFET and a polysilicon film has been used as a material of the gate. As the integration level of the semiconductor devices becomes higher, however, it is required that the line width of the gate and the thickness of the gate insulating film be reduced. In the case where a silicon oxide film is used as the material of the gate insulating film, if the thickness of the gate insulating film is too thin, the insulating characteristic is not stable since the leakage current due to a direct tunneling through the gate insulating film becomes greater.

For example, when a silicon oxide film is used as the gate insulating film of DRAM and logic devices, currently manufactured in mass production, is applied to a 70 nm thickness device, it is expected that its thickness will be 30 Å through 35 Å in DRAM and be 13 Å through 15 Å in logic devices. As the capacitor component, increased by a polysilicon gate depletion effect (PDE), is increased to be 3 Å through 8 Å, however, it is difficult to reduce the electrical thickness (Teff) occupied by a gate oxide film having a thickness in the range of 15 Å through 30 Å.

Therefore, as one method to overcome the above problem, recently there has been an effort to use a high dielectric constant material, having a relatively higher dielectric constant than a silicon oxide film, as the material of the gate insulating film. Also, in order to minimize the polysilicon gate depletion effect, there has been an effort to use a metal gate instead of the polysilicon gate.

In case of the metal gate, a TiN or a WN film, as a barrier metal film, is intervened between the metal film for the gate and the gate insulating film, and a hard mask film, used as an etch mask, is positioned on the metal film for the gate.

However, in the case of forming a metal gate on a silicon oxide gate insulating film according to a conventional technology, there is a problem that a characteristic of the gate insulating film is degraded as follows.

Deposition of a metal film for the gate is commonly performed by sputtering or chemical vapor deposition (CVD). However, by directly depositing the metal film for the gate by sputtering or CVD on a silicon gate insulating film, the interface characteristic and the insulating characteristic of the gate insulating film can be degraded.

FIGS. 1A and 1B are graphs illustrating capacitance (C)—voltage (V) curves of a MOS capacitor formed by sequentially directly depositing a TiN or a WN film as a barrier film and a tungsten (W) film, as a metal film gate, on a gate insulating film made of silicon oxide by means of sputtering according to a conventional technology.

As shown, in the embodiment that includes the steps of sequentially depositing the barrier metal film (TiN or WN) and the tungsten film gate on the silicon oxide gate insulating film, high levels of oxide defect charges are formed due to an excessive interface trap density of about $1E12/eV\text{-}cm^2$ and oxide trap charges of about $1E12/cm^2$ by means of a hump and a hysteresis, respectively, without significant regard to the deposited barrier metal film materials (TiN or WN) and sputtering methods (IMP, collimated, conventional) of the capacitance—voltage characteristic, with a subsequent annealing process not performed. Due to this, there is resulting damage to the gate insulating properties itself and severe damage in the interface with the substrate.

Meanwhile, the damage can be recovered to some degree through a high temperature annealing process of, for example, 800° C., but a complete recovery of the damaged gate insulating film cannot be achieved. Further, the high temperature annealing process is disadvantageous and costly and the electrical thickness (Teff) of the gate insulating film must be increased in order to recover some of the lost properties.

FIGS. 2A through 2C are graphs illustrating capacitance (C)—voltage (V) curves in the TiN metal gate, deposited in a thermal deposition method, of $TiCl_4+NH_3$ at 650° C.

As shown, the MOS transistor characteristic after deposition is relatively better than that deposited by a sputtering method. However, degradation of the gate oxide integrity (GOI) characteristic is caused due to an increase of the electrical thickness (Teff) and the oxide trap charges in the gate insulating film after a subsequent annealing process, that is, increased hysteresis. Particularly, severe degradation of the GOI characteristic can be caused when the MOS capacitors/transistor is manufactured.

SUMMARY OF THE DISCLOSED METHOD

Therefore, the disclosed method is contrived to solve the above problems and an object of the disclosed method is to provide a method of forming a metal gate capable of preventing degradation in the GOI characteristic of the gate insulating film.

In order to accomplish the above object, a method of forming a metal gate according to the disclosed method comprises the steps of providing a silicon substrate having device isolation films of a trench shape for defining an active region; forming a gate insulating film on the surface of the silicon substrate by a thermal oxidization process; sequentially forming a barrier metal film and a metal film for the gate on the gate insulating film; and patterning the metal film for the gate, the barrier metal film and the gate insulating film, wherein deposition of the barrier metal film and the metal film for the gate is performed by means of an atomic layer deposition (ALD) process and/or a remote plasma chemical vapor deposition process.

According to the disclosed method, the barrier metal film and the metal film for the gate are deposited by means of an atomic layer deposition (ALD) process or a remote plasma CVD process. Thus, damage to the gate insulating film that may occur during the process of depositing the films is minimized.

BRIEF DESCRIPTION OF THE DRAWINGS

The aforementioned aspects and other features of the disclosed method will be explained more fully in the following description, taken in conjunction with the accompanying drawings, wherein.

DETAILED DESCRIPTION OF PREFERRED EMBODIMENTS

Figure 1A:
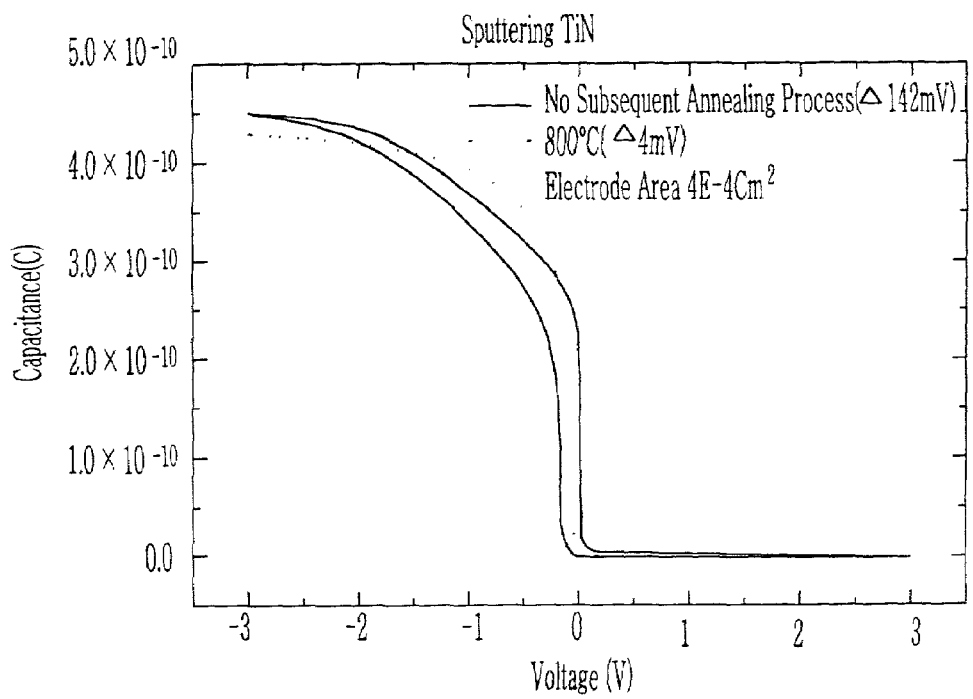
FIGS. 1A and 1B are graphs illustrating capacitance (C)—voltage (V) curves for a directly deposited TiN or WN film and a tungsten (W) film on a silicon oxide film by means of sputtering according to a conventional technology.
Figure 1B:
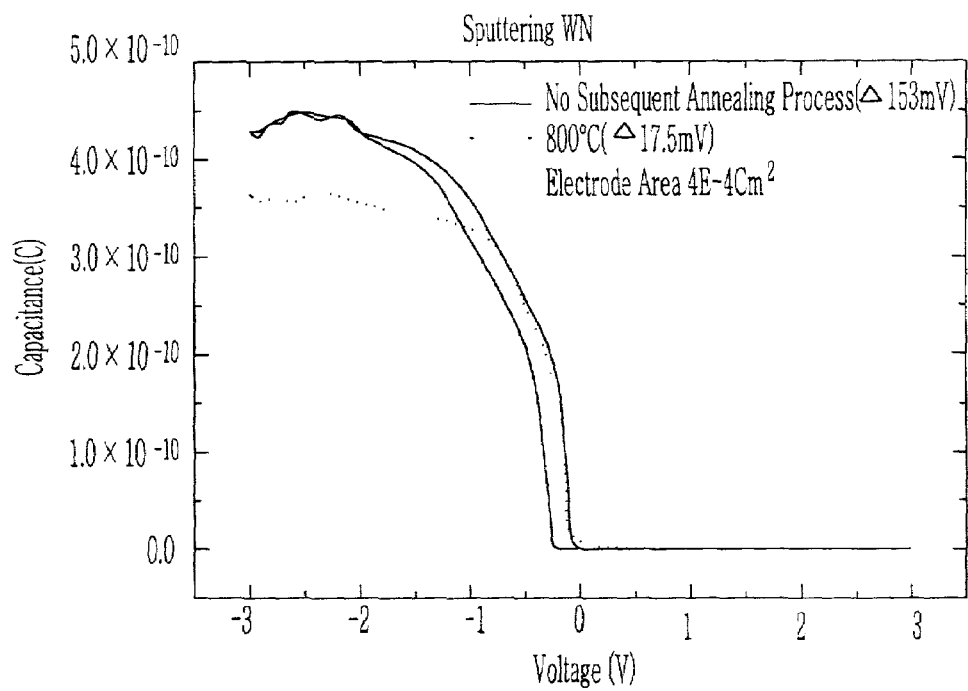
Figure 2A:
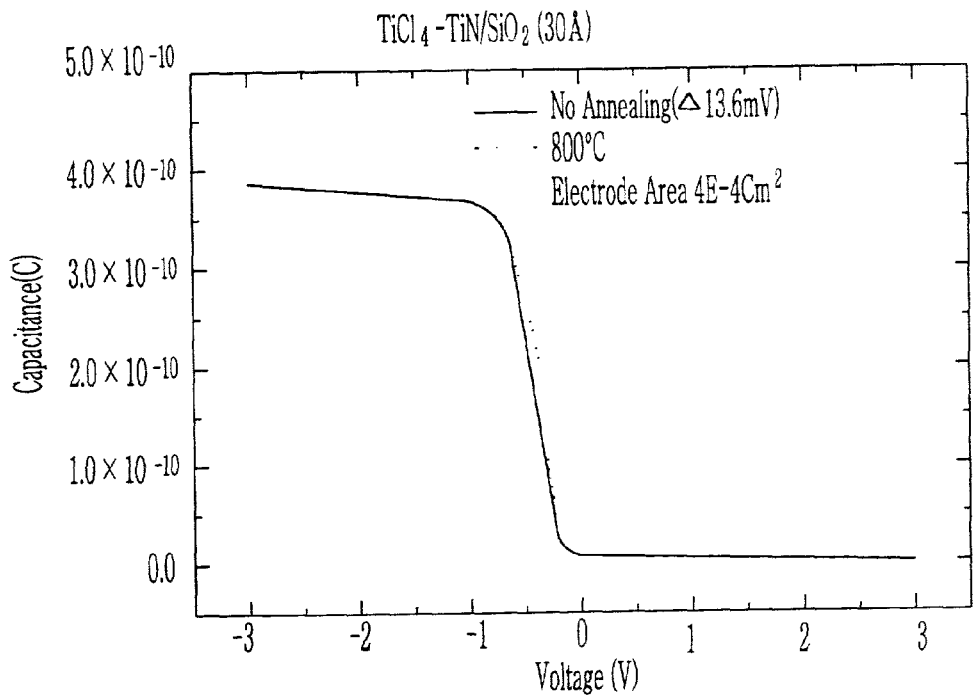
FIGS. 2A through 2C are graphs illustrating capacitance (C)—voltage (V) curves in a TiN metal gate deposited in a thermal deposition method of $TiCl_4+NH_3$ at 650° C. according to a conventional technology.
Figure 2B:
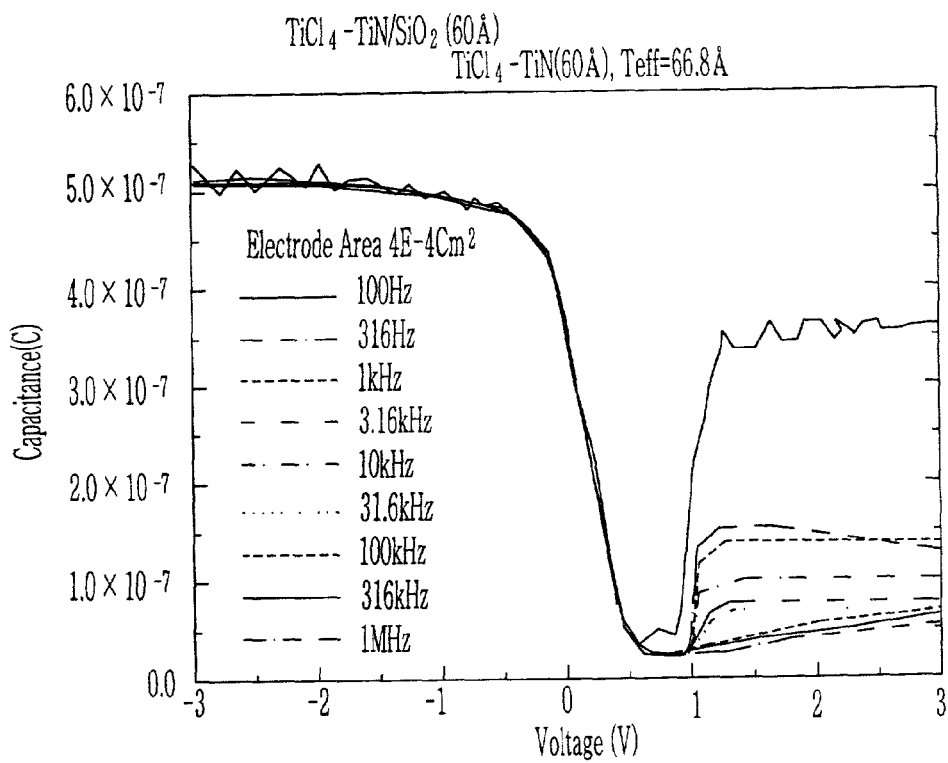
Figure 2C:
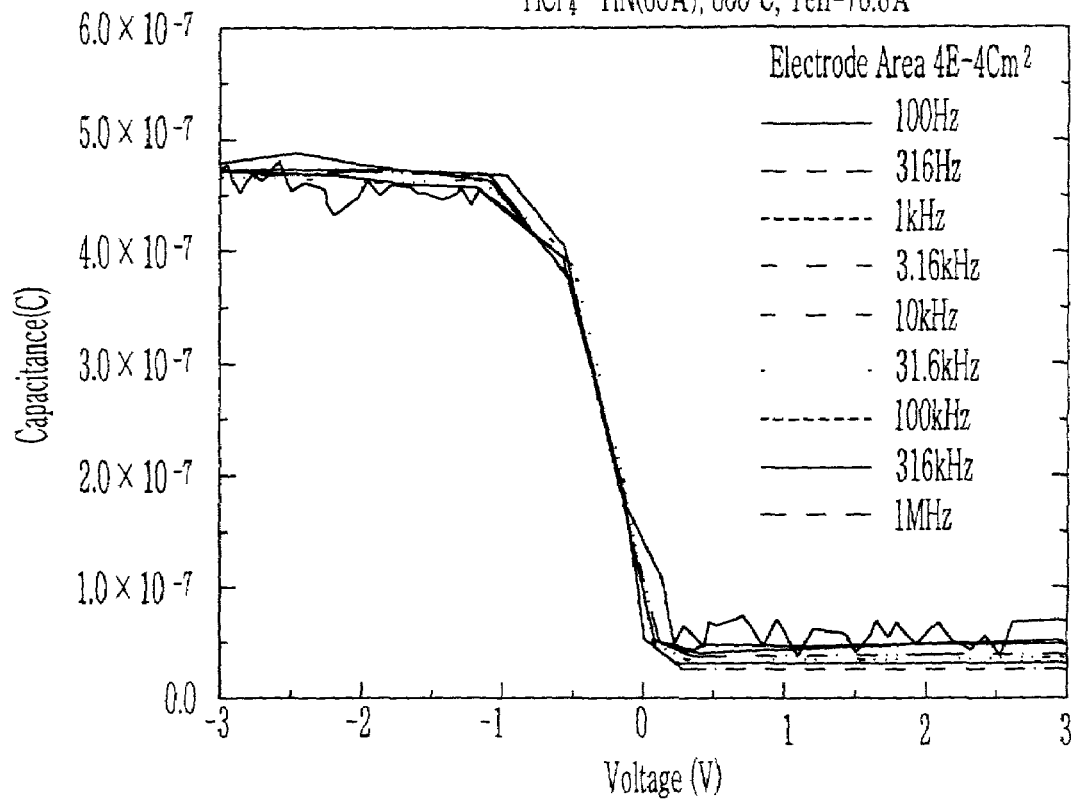

The disclosed method will be described in detail by way of a preferred embodiment with reference to accompanying drawings, in which like reference numerals are used to identify the same or similar parts.

Figure 3A:
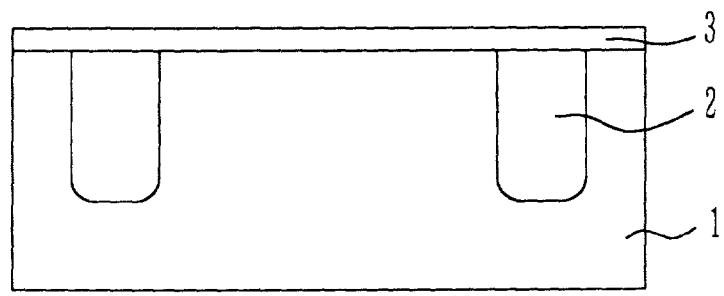
FIGS. 3A through 3C are cross-sectional views of semiconductor devices including a metal gate formed according to one embodiment of the present invention.
Figure 3B:
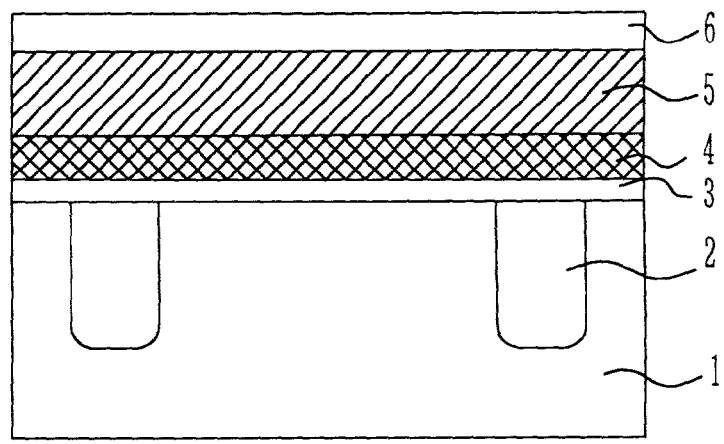
Figure 3C:
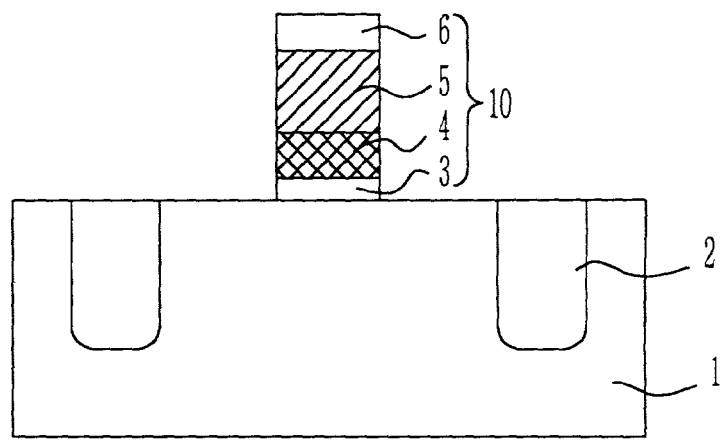

FIGS. 3A through 3C are cross-sectional views of semiconductor devices including a metal gate formed according to one embodiment of the present invention.

Referring now to FIG. 3A, a silicon substrate 1 is provided. Device isolation films 2 of a trench shape for defining an active region are formed at given regions of the silicon substrate 1. At this time, the device isolation films 2 may be formed by means of a common LOCOS process. A gate insulating film 3 made of a silicon oxide and having a thickness of 10 Å through 40 Å is formed on the surface of the silicon substrate 1 by a thermal oxidation process. At this time, it is preferred that the thermal oxidation process be performed in a furnace of 650° C. through 900° C. by means of a wet ($H_2/O_2$) or dry ($O_2$) method.

Meanwhile, a high dielectric constant insulating film of any one or more of $Al_2O_3$, $Ta_2O_5$, $TiO_2$, $ZrO_2$, $HfO_2$, Zr-silicate, Hf-silicate, $La_2O_3$, and 3-dimensional mixed insulating films (ZrAlO, HfAlO, $ZrSiO_4$ and $HfSiO_4$), instead of the silicon oxide film by the thermal oxidation process, may be formed. Also, before the high dielectric constant insulating film is deposited, an ultra thin (e.g., 3 Å to 30 Å) silicon oxide film may be formed. Further, in case of using the high dielectric constant insulating film as a gate insulating film, the high dielectric constant insulating film may be subjected to an annealing process using a rapid thermal process under oxygen, nitrogen or an inactive atmosphere for 10 through 300 seconds, or a furnace process for 10 through 100 minutes and may be subjected to a UV-ozone process.

In addition, though not shown in the drawing, before the gate insulating film 3 is formed, a capacitor may be formed in a trench structure. At this time, the dielectric film may include one of an ON film, $Ta_2O_5$ film, an $Al_2O_3$ film, a BST film or a SBT film.

Referring now to FIG. 3B, a barrier metal film 4 and a metal film 5 for the gate are sequentially deposited on the gate insulating film 3. It is preferred that the barrier metal film 4 and the metal film 5 for the gate be deposited by means of a deposition process, not a high temperature thermal deposition method, for example, an atomic layer deposition (ALD) process or a remote plasma chemical vapor deposition (CVD) process since such processes are not affected by metal penetration or implantation.

In the above, since the ALD process allows deposition by means of cyclic dosing and purging at a temperature in the range of 150° C. through 350° C., degradation of the characteristic of the interface between the gate insulating film 3 and the substrate 1 and the gate insulating film 3 itself can be prevented. It is preferred that the ALD process be performed using one of $N_2$, $NH_3$, $ND_3$ or a mixture thereof as materials for purging a precursor at a temperature in the range of 50° C. through 550° C. and under a pressure in the range of 0.05 Torr through 3 Torr.

Also, since the remote plasma CVD process embodiment forms plasma in a remote location to deposit a thin film, it can obtain the same effect as the ALD process. It is preferred that the remote plasma CVD process be performed using an electron cyclotron resonance (ECR) as a plasma source and He, Ar, Kr, Xe, or a mixture as a plasma excitation gas under the frequency of 2.0 GHz through 9 GHz. In addition, upon the remote plasma CVD process, a metal source such as Ti, introduced into the chamber, is sprayed around the wafer and the source of N is excited around the plasma, so that the Ti and N can be introduced to coat the surface of the wafer.

Meanwhile, the barrier metal film 4 may be formed of one of a group of compounds selected from the group consisting of TiN, TiAlN, TaN, MoN, WN, and mixtures thereof. It is preferred that the thickness of the barrier metal film 4 be in the range of 50 Å through 500 Å. Also, the metal film 5 for the gate may be formed of one of a group consisting of W, Ta, Al, $TiSi_x$, $CoSi_x$ and $NiSi_x$, wherein x is in the range of 0.1 to 2.9, or may be formed in a stack structure of polysilicon, a tungsten nitride film and a tungsten film. It is preferred that the thickness of the metal film 5 for the gate be 300 Å through 1500 Å. The hard mask film 6 may be formed of a silicon oxide film ($SiO_2$), a silicon nitride film ($Si_3N_4$) or silicon oxynitride film (SiON). The thickness of the hard mask film 6 is 300 Å through 2000 Å.

In the above, when the barrier metal film, for example, TiN is deposited by means of an ALD process and/or a remote plasma CVD process, a source of Ti may include $TiCl_4$, TDEAT (Tetrakis (Diethylamino) Titanium) or TDMAT (Tetrakis (Dimethylamino) Titanum) and a source of N may include $N_2$, $NH_3$ or $ND_3$. Also, in the embodiment that includes the step of depositing TiAlN as the barrier metal film, a source of Ti may include $TiCl_4$, TDEAT (Tetrakis (Diethylamino) Titanium) or TDMAT (Tetrakis (Dimethylamino) Titanium), a source of N may include $N_2$, $NH_3$ or $ND_3$, and a source of Al may include $AlCl_3$ or $TMA[Al(CH_3)_3]$. In addition, in the embodiment that includes the step of depositing TaN as the barrier metal film, a source of Ta may include $TaCl_4$ or tantalum tert-butaoxide and a source of N may include $N_2$, $NH_3$ or $ND_3$. Also, in the embodiment that includes the step of depositing MoN as the barrier metal film, a source of Mo may include $MoCl_4$, $MoF_6$ or molybdenum tert-butaoxide and a source of N may include $N_2$, $NH_3$ or $ND_3$. In addition, in the embodiment that includes the step of depositing WN as the barrier metal film, a source of W may include $WF_6$ or $WCl_4$ and a source of N may include $N_2$, $NH_3$ or $ND_3$.

Referring now to FIG. 3C, the hard mask film 6 is patterned, for example, by means of a common photolithography process. Then, the metal film 5 for the gate, the barrier film 4 and the gate insulating film 3 are sequentially etched by means of an etching process using the patterned hard mask film 6 as an etch mask, thus forming a metal gate 10.

The metal gate 10 formed by the disclosed method can prevent degradation in the GOI characteristic of the silicon oxide gate insulating film 3 since the metal film 5 for the gate, including the barrier metal film 4, is deposited by means of an ALD process or a remote plasma CVD process.

Meanwhile, the above-mentioned embodiment has illustrated the process of forming the gate by a traditional gate formation process, that is, the process by which the gate insulating film and a conductive film for the gate are deposited and are then patterned. However, the disclosed method can be applied to a damascene process, by which after a gate formation region is defined through formation and removal of a sacrifice gate, the metal gate is formed in the gate formation region. More particularly, if the method according to the disclosed method (by which the barrier metal film and the metal film for gate are deposited by an ALD process or a remote plasma CVD process) is applied to the gate formation process using the damascene process, a further improved effect can be obtained.

As can be understood from the above description, the disclosed method forms a metal gate, where a barrier metal film and a metal film for the gate are deposited by means of an ALD process or a remote plasma CVD process. Thus, the disclosed method can prevent degradation in the characteristic of a gate insulating film. Therefore, the disclosed method can improve not only a characteristic of the metal gate but also a characteristic of a device. Further, as the ALD process and the remote plasma CVD process have a good step coverage, there is an advantage in the process itself and can be advantageously applied in manufacturing high speed/high density devices.

The disclosed method has been described with reference to a particular embodiment in connection with a particular application. Those having ordinary skill in the art and access to the teachings of the disclosed method will recognize additional modifications and applications within the scope thereof.

It is therefore intended by the appended claims to cover any and all such applications, modifications, and embodiments within the scope of the disclosed method.

What is claimed is:

1. A method of forming a metal gate in a semiconductor device comprising the steps of:
   providing a silicon substrate having one or more device isolation films of a trench shape for defining an active region;
   forming a gate insulating film on the surface of said silicon substrate by means of a thermal oxidization process;
   sequentially forming a barrier metal film and a metal film for a gate on said gate insulating film; and
   patterning said metal film for the gate, said barrier metal film, and said gate insulating film,
   wherein deposition of said barrier metal film and said metal film for the gate is performed by a process selected from a group consisting of an atomic layer deposition (ALD) process, a remote plasma chemical vapor deposition process, and a combination thereof.

2. The method of forming a metal gate in a semiconductor device according to claim 1, wherein said thermal oxidization process is performed at a temperature in the range of 650° C. through 900° C. by means of wet ($H_2/O_2$) or dry ($O_2$) method.

3. The method of forming a metal gate in a semiconductor device according to claim 1, wherein said barrier metal film is selected from the group consisting of TiN, TiAlN, TaN, MoN and WN.

4. The method of forming a metal gate in a semiconductor device according to claim 1, wherein said ALD process is performed using a compound selected from the group consisting of $N_2$, $NH_3$, $ND_3$ and a mixture thereof, as a material for purging a precursor at a temperature in the range of 50° C. through 550° C. under a pressure in the range of 0.05 Torr through 3 Torr.

5. The method of forming a metal gate in a semiconductor device according to claim 1, wherein said metal film for the gate is selected from the group consisting of W, Ta, Al, $TiSi_x$, $CoSi_x$, $NiSi_x$, wherein x is in the range of 0.1 to 2.9, and a mixture thereof.

6. The method of claim 1, wherein the metal film is deposited by an atomic layer deposition (ALD) process.

7. The method of claim 6, wherein said barrier metal film is selected from the group consisting of TiN, TiAlN, TaN, MoN and WN.

* * * * *

UNITED STATES PATENT AND TRADEMARK OFFICE
CERTIFICATE OF CORRECTION

| | | |
|---|---|---|
| PATENT NO. | : 7,157,359 B2 | Page 1 of 1 |
| APPLICATION NO. | : 10/036156 | |
| DATED | : January 2, 2007 | |
| INVENTOR(S) | : Dae G. Park et al. | |

It is certified that error appears in the above-identified patent and that said Letters Patent is hereby corrected as shown below:

At Column 6, line 34, "TialN" should be -- TiAlN--.

Signed and Sealed this

Twenty-eighth Day of August, 2007

JON W. DUDAS
*Director of the United States Patent and Trademark Office*